(12) United States Patent  
Coldren et al.

(10) Patent No.: US 7,174,058 B2  
(45) Date of Patent: Feb. 6, 2007

(54) TRAVELING-WAVE OPTOELECTRONIC WAVELENGTH CONVERTER

(75) Inventors: Christopher W. Coldren, Santa Barbara, CA (US); Larry A. Coldren, Santa Barbara, CA (US)

(73) Assignee: Agility Communications, Inc., Goleta, CA (US)

( * ) Notice: Subject to any disclaimer, the term of this patent is extended or adjusted under 35 U.S.C. 154(b) by 0 days.

(21) Appl. No.: 11/489,067

(22) Filed: Jul. 19, 2006

(65) Prior Publication Data

US 2006/0257065 A1 Nov. 16, 2006

Related U.S. Application Data

(62) Division of application No. 11/359,824, filed on Feb. 22, 2006, now Pat. No. 7,133,576, which is a division of application No. 10/724,942, filed on Dec. 1, 2003, now Pat. No. 7,043,097.

(60) Provisional application No. 60/490,046, filed on Jul. 25, 2003.

(51) Int. Cl.
- *G02F 1/01* (2006.01)
- *G02F 1/125* (2006.01)
- *G02B 6/26* (2006.01)

(52) U.S. Cl. .................. 385/1; 385/4; 385/15
(58) Field of Classification Search .......... 385/1, 385/4, 15
See application file for complete search history.

(56) References Cited

U.S. PATENT DOCUMENTS

| | | | |
|---|---|---|---|
| 4,843,586 A * | 6/1989 | Nazarathy et al. | 708/816 |
| 4,856,899 A | 8/1989 | Iwaoka et al. | 356/454 |
| 5,715,075 A | 2/1998 | Tanaka et al. | 398/48 |
| 6,246,500 B1 * | 6/2001 | Ackerman | 398/115 |
| 6,349,106 B1 | 2/2002 | Coldren | 372/50.1 |
| 6,574,256 B1 | 6/2003 | Hofstetter et al. | 372/45.01 |
| 6,580,739 B1 | 6/2003 | Coldren | 372/50.21 |
| 6,700,517 B1 * | 3/2004 | Kellar | 341/137 |

(Continued)

OTHER PUBLICATIONS

Akage, Y., et al., "Wide bandwidth of over 50 GHz travelling-wave electrode electroabsorption modulator integrated DFB lasers," Electronics Letters, 37(5):299-300, Mar. 2001.

(Continued)

*Primary Examiner*—Kaveh Kianni
(74) *Attorney, Agent, or Firm*—Allen, Dyer, Doppelt, Milbrath & Gilchrist, P.A.

(57) ABSTRACT

Traveling-wave optoelectronic wavelength conversion is provided by a monolithic optoelectronic integrated circuit that includes an interconnected traveling-wave photodetector and traveling-wave optical modulator with a widely tunable laser source. Either parallel and series connections between the photodetector and modulator may be used. An input signal modulated onto a first optical wavelength develops a traveling wave voltage on transmission line electrodes of the traveling-wave photodetector, and this voltage is coupled via an interconnecting transmission line of the same characteristic impedance to transmission line electrodes of the traveling-wave optical modulator to modulate the signal onto a second optical wavelength derived from the tunable laser. The traveling wave voltage is terminated in a load resistor having the same characteristic impedance as the photodetector and modulator transmission lines. However, the interconnecting transmission lines and the load resistor may have different impedances than the photodetector and modulator.

5 Claims, 8 Drawing Sheets

U.S. PATENT DOCUMENTS

| | | | |
|---|---|---|---|
| 2002/0018611 A1* | 2/2002 | Maleki et al. | 385/15 |
| 2003/0029495 A1 | 2/2003 | Mazur et al. | 136/256 |
| 2004/0145026 A1 | 7/2004 | Sun et al. | 257/459 |
| 2004/0207896 A1* | 10/2004 | Aoki et al. | 359/237 |
| 2006/0159381 A1* | 7/2006 | Tsuzuki et al. | 385/1 |

OTHER PUBLICATIONS

Akulova, Y.A., et al., "Widely-tunable electroabsorption-modulated sampled-grating DBR laser transmitter," J. Selected Topics in Quantum Electronics, 8(6):1349-1357, Nov./Dec. 2002.

Akoi, M., et al., "InGaAs/InGaAsP MQW electroabsorption modulator integrated with a DFB laser fabricated by band-gap energy control selective area MOCVD," IEEE Journal of Quantum Electronics, 29(6):2088-2096, Jun. 1993.

Barton, J.S., et al., "Integration of a Mach-Zehnder Modulator with Sampled Grating Distributed Bragg Reflector Laser," Proc. Integrated Photonics Research Conference, paper No. IFC3-1, Jul. 17-19, 2002.

Coldren, L.S., "Widely-Tunable Chip-Scale Transmitters and Wavelength Converters," Proc. Integrated Photonics Research Topical Meeting, OSA, Washington, D.C., Jun. 16, 2003.

Dagli, N., "Wide bandwidth lasers and modulators for RF photonics," IEEE Trans. Microwave Theory and Tech., 47(7):1151-1171, Jul. 1999.

Jayaraman, V., et al., "Theory, design, and performance of extended tuning range semiconductor lasers with sampled gratings," IEEE Journal of Quantum Electronics, 29(6):1824-1834, Jun. 1993.

Kim, H., et al., "Chirp characteristics of dual-drive Mach-Zehnder modulator with a finite DC extinction ratio," IEEE Photonics Technology Letters, 14(3):298-300, Mar. 2002.

Kodama, S., et al., "320 Gb/s optical gate monolithically integrating photodiode and electroabsorption modulator," Electronics Letts., 39(4):383-385, Feb. 20, 2003.

Li, X., et al., "Modeling and design of a DFB laser integrated electroabsorption modulator," IEEE Journal of Quantum Electronics, 34(10):1807-1815, Oct. 1998.

Mason, B., et al., "Widely tunable sampled grating DBR laser with integrated elelctroabsorption modulator," IEEE Photonics Technology Letters, 11(6):638-640, Jun. 1999.

Skogen, E.J., et al., "A quantum-well-intermixing process for wavelength-agile photonic integrated circuits," IEEE Journal of Selected Topics in Quantum Electronics, 8(4):863-869, Jul.-Aug. 2002.

Walker, R.G., "High-speed III-V semiconductor Intensity Modulators," IEEE J. Quantum Electronics, 27(3):654-667, Mar. 1991.

* cited by examiner

TRAVELING-WAVE OPTOELECTRONIC WAVELENGTH CONVERTER

CROSS-REFERENCE TO RELATED APPLICATIONS

The present application is a divisional of U.S. patent application Ser. No. 11/359,824, entitled "Traveling-Wave Optoelectronic Wavelength Converter", filed on Feb. 22, 2006 now U.S. Pat. No. 7,133,576, which is a divisional of U.S. patent application Ser. No. 10/724,942, entitled "Traveling-Wave Optoelectronic Wavelength Converter", filed on Dec. 1, 2003, now U.S. Pat. No. 7,043,097, which claims priority from provisional application U.S. Patent Application Ser. No. 60/490,046 entitled "Traveling-Wave Optoelectronic Wavelength Converter" filed Jul. 25, 2003, which are incorporated herein by reference for all purposes.

BACKGROUND OF THE INVENTION

1. Field of the Invention

This invention relates to microelectronic and optoelectronic components, and more particularly, to a traveling-wave optoelectronic wavelength converter.

2. Description of the Related Art (Note: This application incorporates a number of different references as indicated throughout the specification by numbers enclosed in brackets, e.g., [x]. A list of these different references ordered according to these numbers can be found below in the section of the specification entitled "References." Each of these references is incorporated by reference herein.)

The present invention relates to wavelength converters of the type desirable in certain wavelength division multiplexed optical communication systems, as well as other applications where it is desirable to change the wavelength of the optical carrier of a modulated lightwave, and more particularly to optoelectronic wavelength converters in which an incoming lightwave having a first wavelength is detected by a photodetector that produces an electrical signal that in turn modulates the outgoing lightwave having a second desired wavelength.

In the prior art [1, 13, 14], lumped-element photodetectors and modulators were employed. These provide limitations on the signal bandwidth, B, and wavelength conversion efficiency, $P_{out}/P_{in}$, wherein $P_{out}$ is the output signal power and $P_{in}$ is the input signal power. The signal bandwidth is limited by the cutoff frequency, $B < (2\pi R_L C_T)^{-1}$, wherein $R_L$ is the load resistance and $C_T$ is the sum of the detector and modulator capacitances. This can be severely limited because the lengths of both the photodetector and modulator need to be relatively long for efficient operation, and this results in a relatively large capacitance.

In conventional waveguide photodetectors, their optical absorption length must be relatively long to absorb all of the input light at high optical powers and provide high output photocurrent, $I_{ph}$. In conventional modulators their optical interaction length, $l_m$, must also be relatively long to provide high extinction with a relatively low applied voltage, $V_m$, as approximately characterized by a constant $V_m l_m$ product for a given modulation level. Because this voltage is proportional to the load resistance, $V_m = I_{ph} R_L$, the efficiency of modulation, and thus wavelength conversion, increases in proportion to the load resistance. Thus, $R_L$ must be as large as possible for efficient wavelength conversion, but this limits the bandwidth of operation.

Therefore, there is a severe trade-off between the bandwidth of the signal and the efficiency of conversion in a lumped-element optoelectronic wavelength converter. Taking the above relationships into account, it can be shown that the wavelength conversion efficiency is limited to, $P_{out}/P_{in} = KP_{in}/B$, where K is a constant of proportionality consisting of fixed geometrical factors and universal constants. Assuming reasonable parameters in an InP monolithic wavelength converter assembly [1, 12], it can be shown that B is limited to be less than about 10 Gb/s for near unity wavelength conversion efficiency. In fact, to obtain this bandwidth, the input power to the photodetector must be quite large (>50 mW), which is much larger than the saturation power of conventional photodetectors.

Thus, there is a need for a new optoelectronic wavelength converter geometry that can operate at higher bandwidths with high efficiency. There is also a need for higher saturation power photodetectors that may be compatibly integrated monolithically with the other elements of the wavelength converter in order to avoid the need for any electronic amplification. Also, to limit the required input power to the wavelength converter chip, it is desired to incorporate integrated semiconductor-optical-amplifiers (SOAs) to pre-amplify the incoming lightwave prior to entering the photodetector.

Furthermore, for these devices to be manufacturable with low cost, size, power dissipation, and weight, all of the elements of the wavelength converter must be monolithically integrable on a single semiconductor chip. This includes the widely-tunable laser needed to create the output optical lightwave at an arbitrary wavelength within the band of interest. In addition, for a variety of applications where space is at a premium, it is also desirable to be able to integrate arrays of these wavelength converters on a single semiconductor chip.

SUMMARY OF THE INVENTION

The present invention describes a monolithic wavelength converter assembly that provides for optical signal regeneration or amplification without using electronic circuits. The monolithic wavelength converter assembly uses a common layer structure and includes a widely-tunable laser and interconnected traveling-wave photodetector (TWPD) and traveling-wave modulator (TWM) for improved efficiency and signal bandwidth compared to lumped element embodiments. In addition, a semiconductor optical amplifier (SOA) may precede the TWPD to preamplify the input signal to improve electrical signal level, modulation extinction, output optical signal level or wavelength conversion efficiency. Preferably, the monolithic wavelength converter assembly can be integrated in arrays of devices on a single semiconductor chip.

Either parallel or series connections between the TWPD and TWM may be used to provide desirable solutions for a given set of specifications. Using a series connection, an input signal on a first lightwave with a first wavelength creates an electrical signal in the TWPD that propagates along an interconnecting electrical transmission line to the TWM where the electrical signal is imprinted onto a second lightwave with a second selectable wavelength derived from the widely-tunable laser. Using a parallel connection, the TWPD and TWM are positioned side-by-side within an electrical transmission line such that an electrical signal generated by the TWPD in response to an input signal on a first lightwave with a first wavelength simultaneously propagates along the TWM where the electrical signal is imprinted onto a second lightwave with a second selectable wavelength derived from the widely-tunable laser.

The interconnecting transmission lines between the traveling-wave photodetector and the traveling-wave modulator and between the traveling-wave modulator and load resistor are used as impedance transformers to provide for enhanced wavelength conversion performance over some signal bandwidth. For example, the interconnecting electrical transmission line is terminated in resistance $R_L$. In a first embodiment, an electrical impedance of the TWPD, interconnecting electrical transmission line and TWM all are equal to $R_L$. In a second embodiment, an electrical impedance of the TWPD, interconnecting electrical transmission line, TWM and $R_L$ are different, but are chosen to maximize an optical-to-optical signal conversion efficiency or output signal level.

Preferably, the TWPD is a high saturation power photodetector with minimal length and capacitance that are compatible with the monolithic wavelength converter technology platform. An effective bandgap of an absorber within the TWPD is decreased from larger than a photon energy to lower than the photon energy from an input to an output of the TWPD.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

Traveling-wave optoelectronic wavelength conversion is provided by a monolithic optoelectronic integrated circuit that includes an interconnected traveling-wave photodetector and traveling-wave optical modulator with a widely tunable laser source. Embodiments with either parallel and series connections between the photodetector and modulator are included.

An input signal modulated onto a first optical wavelength develops a traveling wave voltage on the transmission line electrodes of the traveling-wave photodetector, and this voltage is coupled via a transmission line of the same characteristic impedance to the transmission line electrodes of the traveling-wave optical modulator to modulate the signal onto a second optical wavelength derived from the tunable laser. The traveling wave voltage is then terminated in a load resistor having the same characteristic impedance as the photodetector and modulator transmission lines. In an alternative embodiment, the interconnecting transmission line and the load resistor have different impedances than the photodetector and modulator, in order to provide better impedance matching over some signal bandwidth. Because of this impedance matching and the fact that the traveling wave voltage travels at nearly the same velocity as the optical waves, highly efficient wavelength conversion over a wide signal bandwidth is provided.

Embodiments

Figure 1:
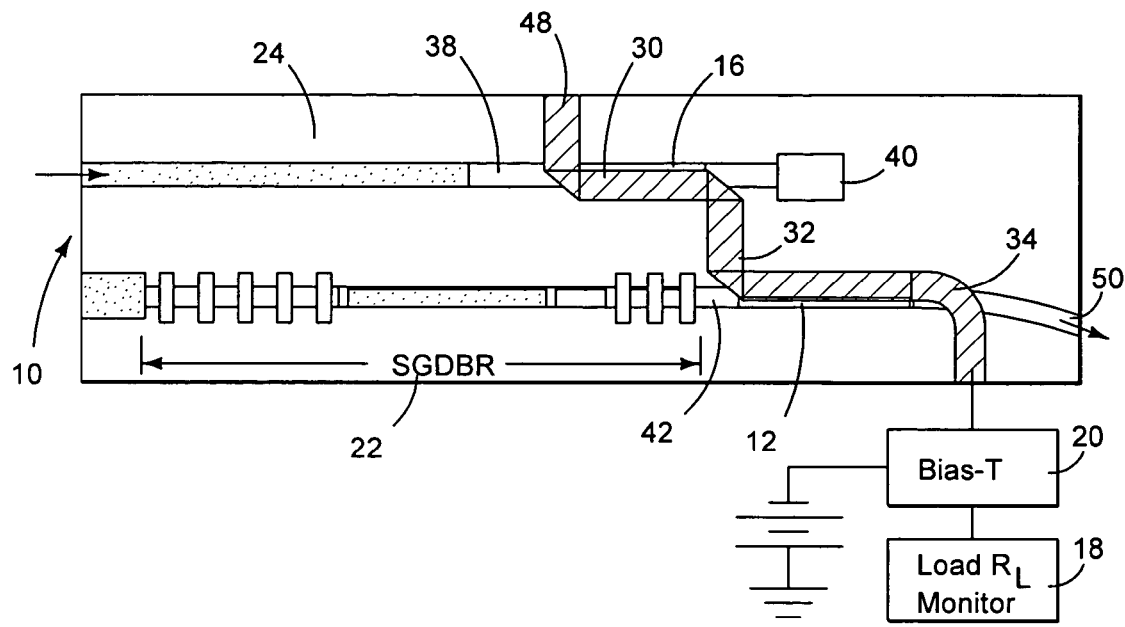
FIG. 1 is a schematic of a series-connected traveling-wave optoelectronic wavelength converter assembly including a photodetector and electro-absorption modulator.
Figure 2:
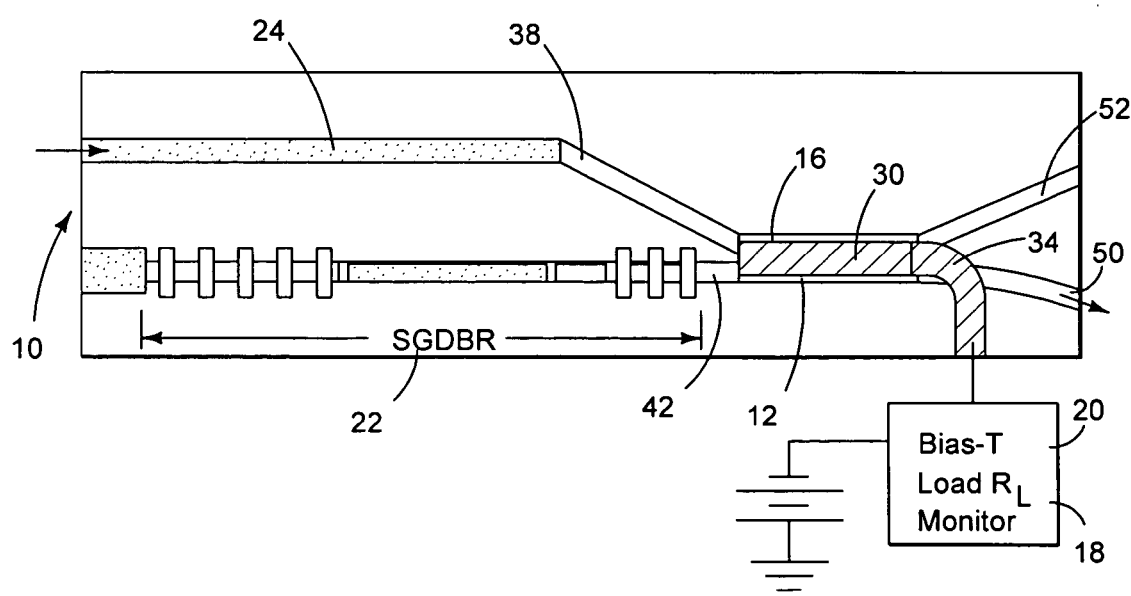
FIG. 2 is a schematic of a parallel-connected optoelectronic wavelength converter assembly including a photodetector and electro-absorption modulator.

FIGS. 1–5 illustrate five embodiments of traveling-wave optoelectronic wavelength converter assemblies 10 that provide for increased operating bandwidth with higher efficiency than possible with lump-element wavelength converters. FIGS. 1 and 2 employ a traveling-wave electro-absorption modulator (TWEAM) 12, and FIGS. 3, 4 and 5 employ a traveling-wave Mach-Zehnder interferometric modulator (TWMZM) 14. The TWEAM 12 has a smaller footprint and may require lower voltages, while the TWMZM 14 allows for better chirp control and can provide more output power. The TWEAM 12 and TWMZM 14 are generically referred to as a traveling-wave modulator (TWM) 12, 14.

Figure 3:
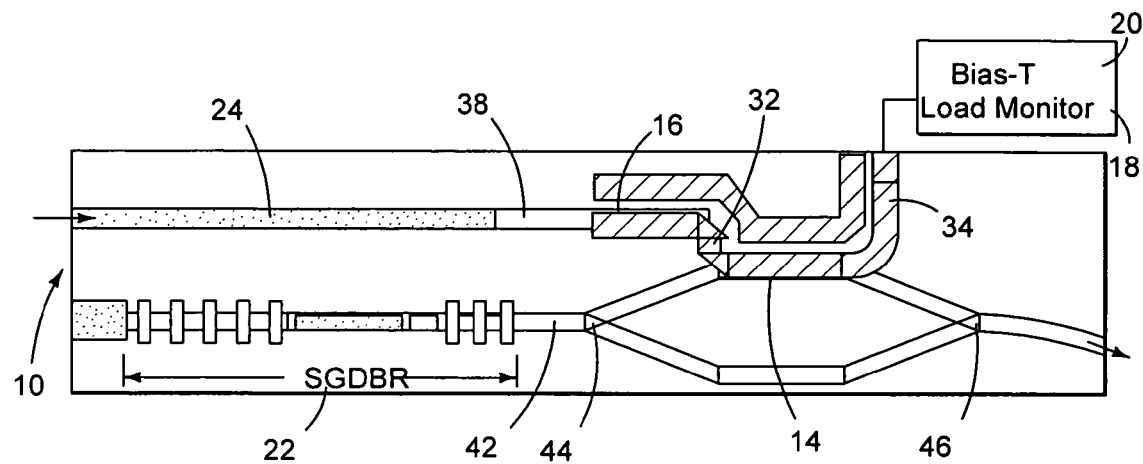
FIG. 3 is a schematic of a series-connected optoelectronic wavelength converter assembly including a photodetector and Mach-Zehnder modulator.
Figure 4:
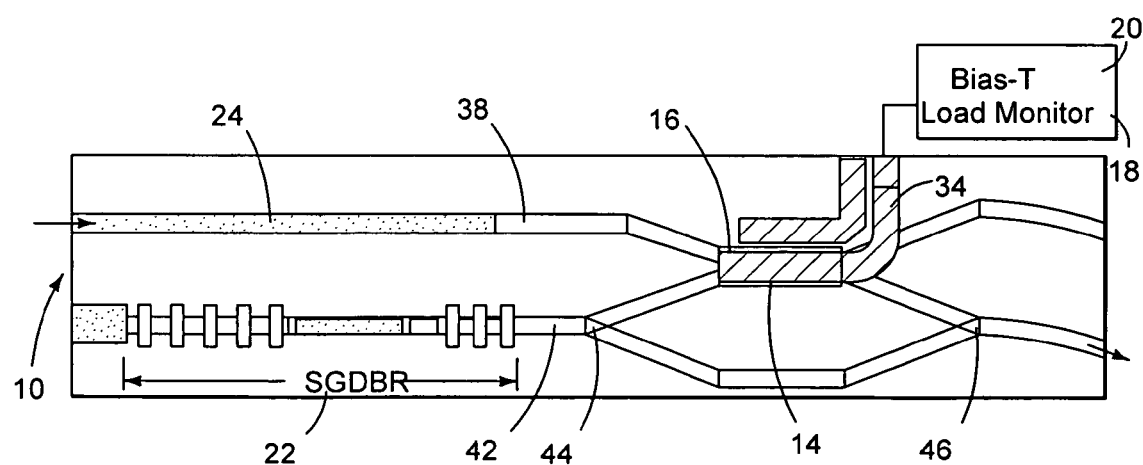
FIG. 4 is a schematic of a parallel-connected optoelectronic wavelength converter assembly including a photodetector and Mach-Zehnder modulator.
Figure 5:
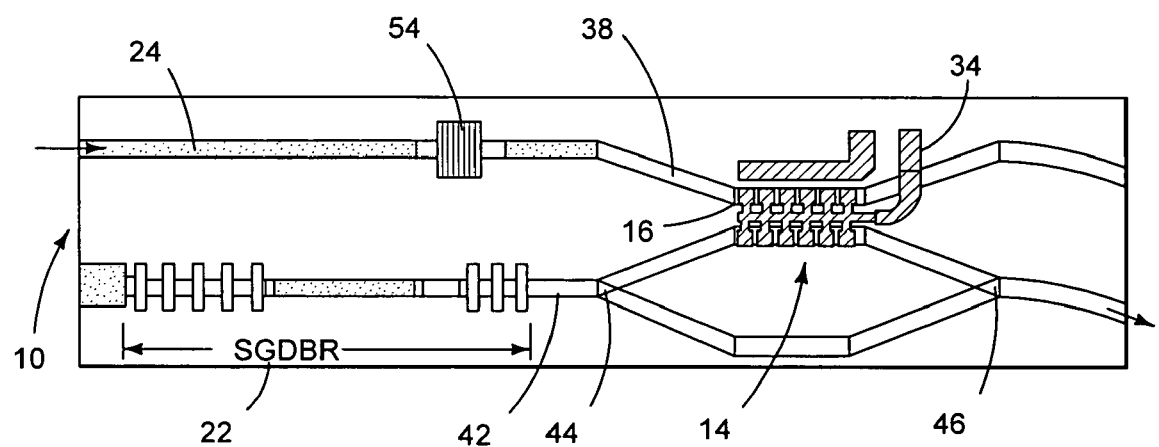
FIG. 5 is a second embodiment of a parallel-connected optoelectronic wavelength converter assembly including a higher-impedance electrical transmission line between a photodetector and Mach-Zehnder modulator as well as a linearized SOA preamplifier.

FIGS. 1 and 3 use a series connection of the traveling-wave photodetector (TWPD) 16 and TWM 12, 14 elements, while FIGS. 2, 4 and 5 use a parallel connection of these elements. The series connection allows for separate optimization of the characteristic impedances of the TWPD 16, the TWM 12, 14, and the electrical transmission lines between the TWPD 16 and TWM 12, 14, as well as the modulator and terminating load resistance. The parallel connection is more compact, and it avoids electrical losses in the interconnecting transmission line. Each embodiment is desirable in some subset of applications.

In all cases, the traveling-wave optoelectronic wavelength converter assemblies 10 are desirably formed on a single semiconductor chip, and arrays of the same or different embodiments can also be formed on a single semiconductor chip using the same wafer layer structure and fabrication procedure. Only one optical input and one optical output is required to carry the signal to and from the chip, and all electrical connections are DC bias connections, except for the case of an external load/monitoring resistor, which requires an extension of the RF electrical transmission line to this port.

FIGS. 1–4 indicate an external load resistor/monitor 18 following a "bias-T" 20, but the load following the TWM 12, 14 could also be fabricated with an on-chip resistor. The DC bias could also be applied at the TWPD 16 end rather than at the TWM 12, 14 end to avoid the need for a bias T.

In all cases, a widely tunable laser 22 is included on the same chip within the wavelength converter assembly 10 to provide a large number of possible output wavelengths. A widely-tunable four-section SGDBR type of tunable laser 22 is illustrated, but other varieties such as tunable SGDBRs, DFBs, or DBRs, as are well-known in the art, are also possible. The SGDBR type of tunable laser 22 has full-band tunability and is easily integrable with the other elements of the monolithic wavelength converter assembly 10. Its monolithic integration avoids coupling losses and unwanted reflections from added interfaces. Thus, no isolator is necessary between the laser 22 and TWM 12, 14 sections. This laser 22 is also fabricated from the same semiconductor layer structure with the same fabrication steps in one growth and processing procedure for the entire wavelength converter assembly 10.

In all cases, the TWPD 16 is desirably preceded by a semiconductor optical amplifier (SOA) 24 to provide signal gain to compensate for the input and output optical coupling losses as well as the optical-to-electrical and electrical-to-optical conversion efficiencies of the TWPD 16 and TWM 12, 14, respectively. An SOA 24 can also be placed after the widely-tunable laser 22 or after the TWM 12, 14 to further increase output power and overall conversion efficiency. However, if placed after the TWM 12, 14, the SOA 24 may also provide unwanted signal chirp or bandwidth limitations, so this is generally not a desirable location for an SOA 24. Also, for good extinction of the output optical beam, as well as to avoid excessive photocurrent from the TWEAM 12 in FIGS. 1 and 2, it is desirable to apply most of the SOA 24 gain before the TWPD 16. This provides for a large photocurrent, which in turn, provides a large voltage swing across the TWM 12, 14 for good extinction.

However, this SOA 24 does also add the requirement that the TWPD 16 have a high saturation power, so this is another aspect of this invention.

As is well-known in the art, the TWPD 16 and TWM 12, 14 overcome the trade-off in conversion efficiency versus modulation bandwidth discussed in the background section. See, for example, [2, 7, 8]. However, in the prior art, each of these devices was separately connected to an external electrical receiver or driver, respectively. In the present invention, the TWPD 16 directly drives the TWM 12, 14 via a matched interconnecting electrical transmission line without an external electronic circuit to receive, amplify, and regenerate the photocurrent before it is applied to the TWM 12, 14. This optical-electronic-optical (OEO) approach is known to be expensive in size, power, and weight as well as in actual cost. It also tends to be limited in bandwidth because of the finite bandwidth of the electronics involved. In the present invention, the electronics is avoided, and any required gain is provided by SOAs 24.

Figure 6A:
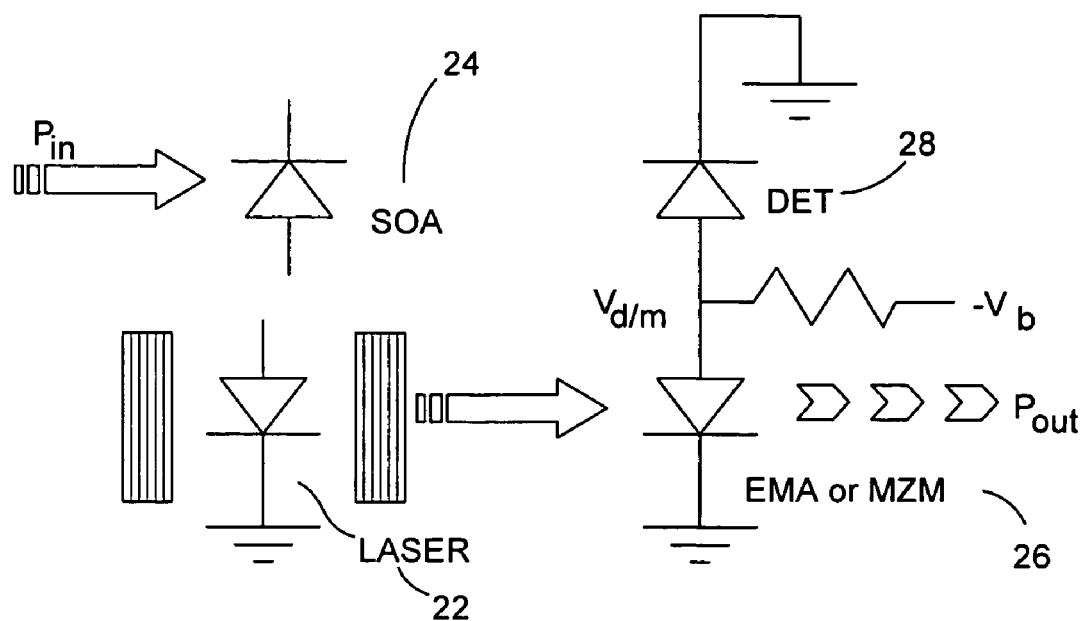
FIG. 6a is a schematic lumped-element circuit of photodetector, laser, modulator, and load resistor with an optional semiconductor optical amplifier at the detector input.
Figure 6B:
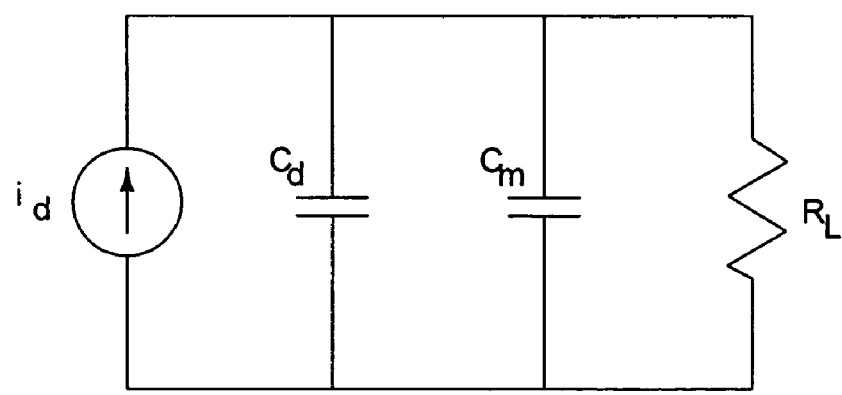
FIG. 6b is an AC-equivalent circuit of electrically-connected photodetector-modulator-load.

The traveling-wave design enables the use of longer photodetectors and modulators than is possible in lumped-element designs, as illustrated by the equivalent circuits of FIGS. 6a–b. In FIGS. 6a–b, the lumped-element modulator 26, which may be a EAM or MZM, must be kept relatively short to keep its capacitance low to enable high bandwidth operation. The same holds for the lumped-element photodiode 28. As mentioned in the background section, the cut-off frequency is inversely proportional to the total capacitance, $C_T=C_d+C_m$, and the load resistance, i.e., $f_c=1/[2\pi C_T R_L]$. A relatively short modulator 26 requires a high drive voltage (a certain $V_m l_m$-product is required for a given extinction), and this requires a high input power, resulting in poor conversion efficiency. As outlined in the background section, the conversion efficiency is, thus, limited to $P_{out}/P_{in}=KP_{in}/B$ in this lumped-element case. The SOA 24 and the laser 22 indicated by the other diodes may be the same as in other cases.

However, with the traveling-wave designs of the present invention, as illustrated by the schematics and AC-equivalent circuits of FIGS. 7a–b and 8a–b, the conversion efficiency does not depend on the bandwidth in such a direct way. The major difference in the AC-equivalent circuits between the lumped-element case of FIGS. 6a–b that the traveling wave case of FIGS. 7a–b or 8a–b is that the distributed capacitance is broken up into a number of incremental elements and the distributed line inductance is also shown by incremental elements. Because the incremental capacitance, $C_i$, between the electrodes of the TWPD 16 (i=d), the interconnecting lines (i=dm, mR), or TWM (i=m) is combined with the incremental electrode inductance, $L_i$, to provide a transmission line 30 of characteristic impedance, $Z_i=[L_i/C_i]^{1/2}$, for section i, the modulation bandwidth is not limited by the RC-time constant. Rather, it is only limited by the velocity mismatch, $\Delta v$, between the optical and electrical waves as well as the resistive losses in the electrodes of the electrical transmission line, as is known in the art. For example, such issues are discussed in [7]. The cut-off frequency due to velocity mismatch is approximately given by, $f_c=c^2/[2\pi l_i n^2 \Delta v]$, where $l_i$ is the length of the TWPD 16 or TWM 12, 14. In the case of optical and electrical waves in the GHz range traveling on InP or similar III–V materials, the relative velocity mismatch is only ~10%, so over lengths, $l_i$~1 mm, the maximum bandwidth due to velocity mismatch is still >500 GHz. Therefore, resistive losses in the metallic conductors tend to provide the most significant limitation on bandwidth, but prior work with isolated TWPDs 16 and TWMs 12, 14 has shown that ~100 GHz bandwidth is possible with proper electrode design for lengths $l_i$~1 mm.

The cut-off frequency due to the TWM 12, 14, is generally a little lower than for the TWPD 16, because the TWM 12, 14 is generally a little longer than the TWPD 16. The TWPD 16 only needs to be as long as necessary to absorb the input lightwave; however, the TWM 12, 14 is made as long as practical in order to reduce its required drive voltage, again recalling that its required drive voltage is inversely proportional to its length for a given extinction. Thus, in practice the TWM 12, 14 transmission line will be made as long as possible, provided sufficient bandwidth for the application at hand is available.

In this traveling-wave case, impedance matching between the various elements along the transmission line is very important to avoid unwanted compromises in bandwidth and efficiency. This can be accomplished by using the same impedance throughout, $Z_d=Z_{dm}=Z_m=Z_{mR}=R_L$. Or, it is also possible, and in some cases desirable, to use the interconnecting transmission lines 32 or 34 between TWPD 16 and TWM 12, 14, or between TWM 12, 14 and the load resistor 18, respectively, to transform the impedance of one element to the other in order to provide an overall improvement in efficiency of the wavelength converter assembly 10 over some signal bandwidth. In the parallel-connected case of FIG. 8, there is no transmission line between TWPD 16 and the TWM 12, 14, since they are continuously connected under a single transmission line.

Figure 9A:
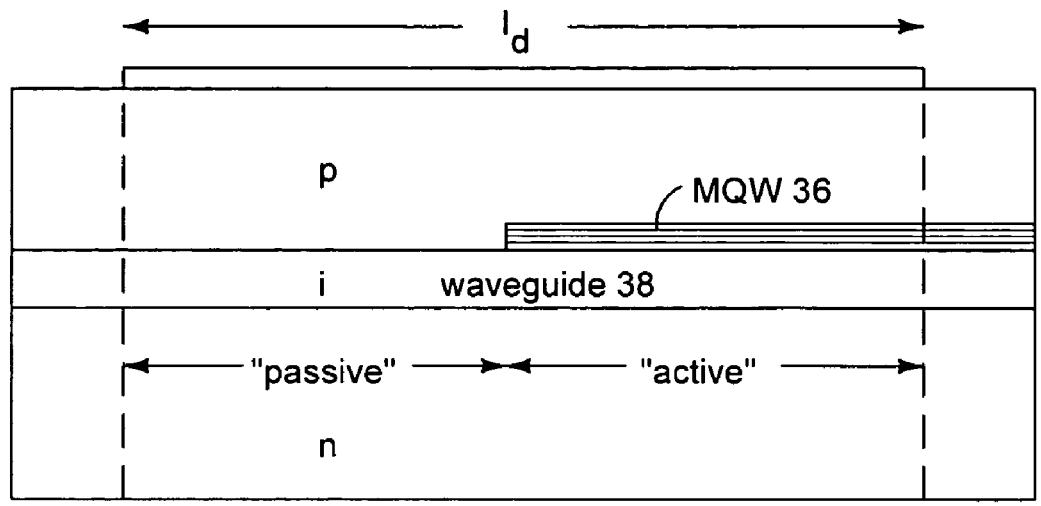
FIG. 9a is a schematic of a high-saturation-power traveling-wave photodetector illustrating regions of different bandgap and optical mode decay, wherein an initial "passive" region uses Franz-Kelkysh effect in waveguide with a higher energy bandgap than the photon energy for reduced absorption; final "active" waveguide adds multiple-quantum-well region with a bandgap smaller than the photon energy for increased absorption.
Figure 9B:
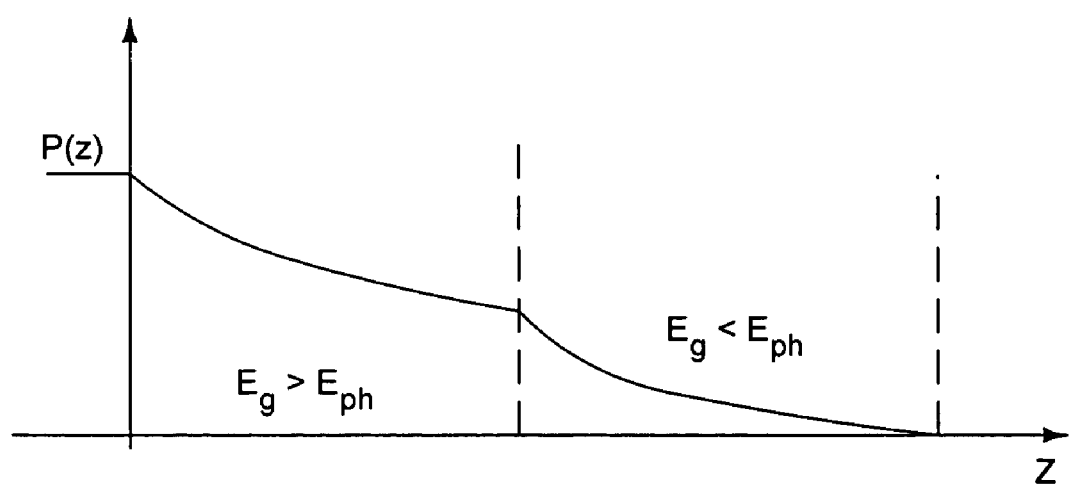
FIG. 9b is a plot that shows optical power decay within the photodetector illustrating smaller absorption coefficient in the initial passive region.

Another novel feature of the optoelectronic wavelength converter assemblies of FIGS. 1–5 is in the axial design of the TWPD 16 illustrated in the cross section and power decay plot in FIGS. 9*a–b*. As discussed above, it is desirable to have a TWPD 16 that can receive a high power level and deliver a large photocurrent without any significant saturation, so that a relatively large voltage swing can be developed across the TWM 12, 14. This is especially true in analog applications where linearity is important. Thus, to increase the saturation power of TWPD 16, an optional bandgap variation along its length is incorporated. The different bandgap regions change the effective absorption coefficient for the traveling optical wave, and this changes the current density derived at each point along the length of the TWPD 16. For higher saturation power, a higher bandgap region is used at the front end of the TWPD 16 with reduced absorption, providing reduced current density, and thus, a higher saturation power level. As the power decays into the TWPD 16, the absorption level can be increased without exceeding the critical current density level at which the device would saturate.

Although a continuous change in effective bandgap and optical absorption constant might be optimal, incorporating just two different bandgaps along the length of TWPD 16, as illustrated explicitly in FIGS. 9*a–b*, can provide a significant increase in its power handling capability. This is most easily and compatibly accomplished by making use of the two different bandgap regions already incorporated in the technology platform used to make the widely-tunable SGDBR lasers 22, as well as the interconnecting waveguides, SOAs 24, and TWM 12, 14. As discussed in references [15,11], these two different bandgap regions can be obtained in several ways. FIG. 9*a* shows multiple-quantum-well (MQW) active layers 36 grown on top of the common waveguide 38 that extends throughout the device for the "active" regions, and a selective removal of these in the desired "passive" regions for an effective larger energy bandgap there. Or, as discussed in the references, quantum-wells can be grown in the center of the common waveguide 38 and then selectively "intermixed" in regions where a larger effective energy bandgap or optical absorption edge is desired by selectively ion implanting some species near the waveguide to create vacancies and thermally annealing to diffuse these vacancies across the quantum-wells, thereby intermixing the well and barrier materials and increasing the energy gap. Alternatively, other approaches to change the effective energy bandgap of the optical waveguide 38, as are well known in the art, can be used. One common approach is "butt-joint regrowth" in which the waveguide is etched away and replaced in an epitaxial regrowth step with another waveguide of material that has the desired energy bandgap.

The relationships amongst the various elements of the optoelectronic wavelength converter assemblies 10 can be appreciated by following the lightwave and electrical signal paths within the five embodiments identified in FIGS. 1–5.

Figure 7A:
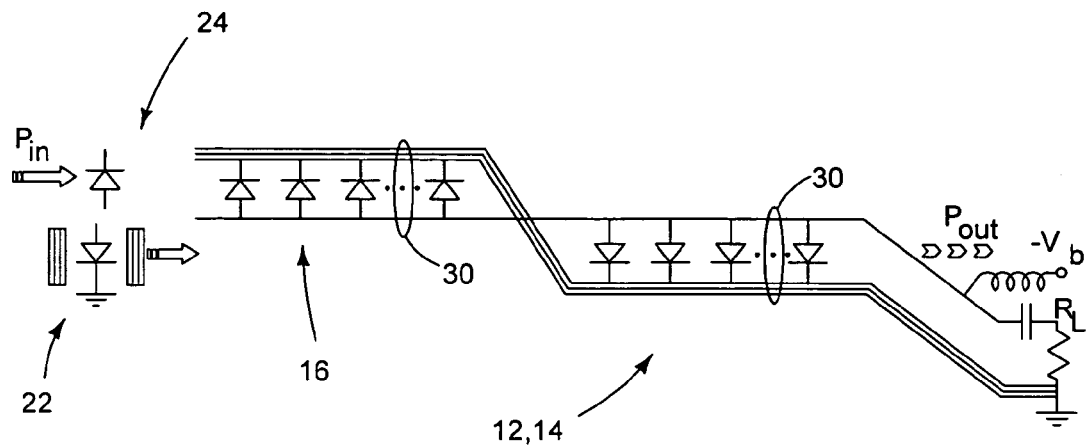
FIG. 7a is a circuit schematic and FIG. 7b is an AC-equivalent circuit of series-connected traveling wave embodiments of this invention, which are representative of FIGS. 1 and 3 in which the electrical signal from the traveling-wave photodetector propagates to the traveling-wave modulator via an electrical transmission line.
Figure 7B:
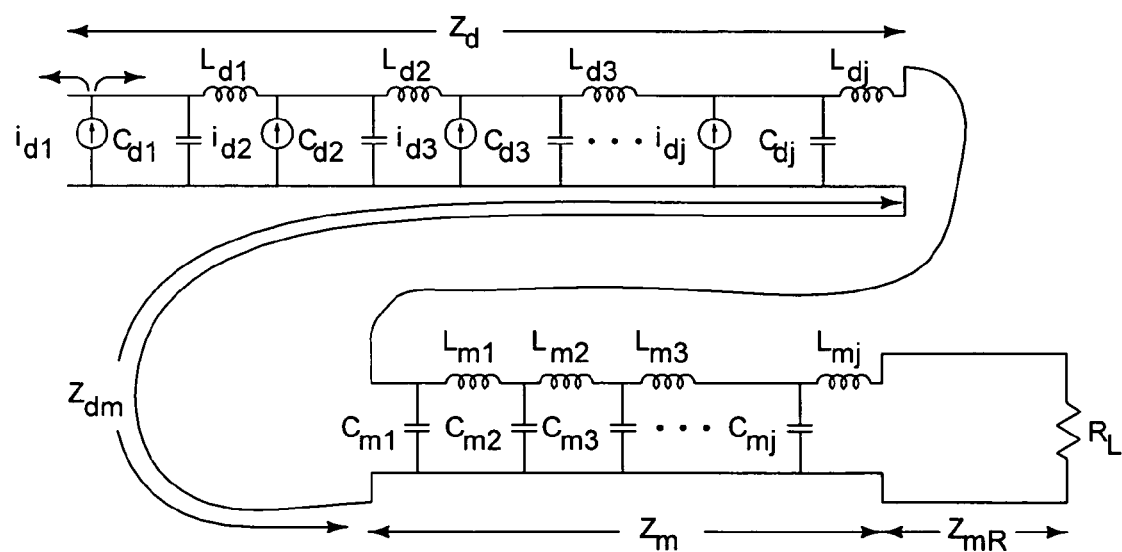
Figure 8A:
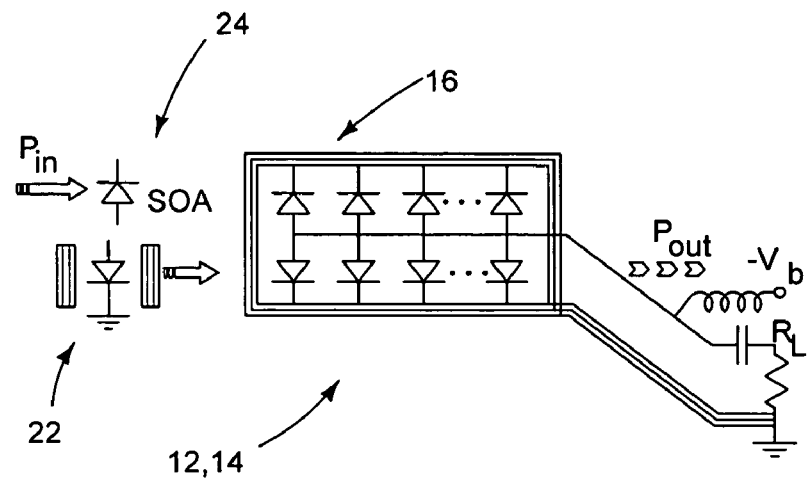
FIG. 8a is a circuit schematic and FIG. 8b is an AC-equivalent circuit of parallel-connected traveling wave embodiments of this invention, which are representative of FIGS. 2 and 4 in which a common transmission line encompasses both the traveling-wave photodetector and the traveling-wave modulator.
Figure 8B:
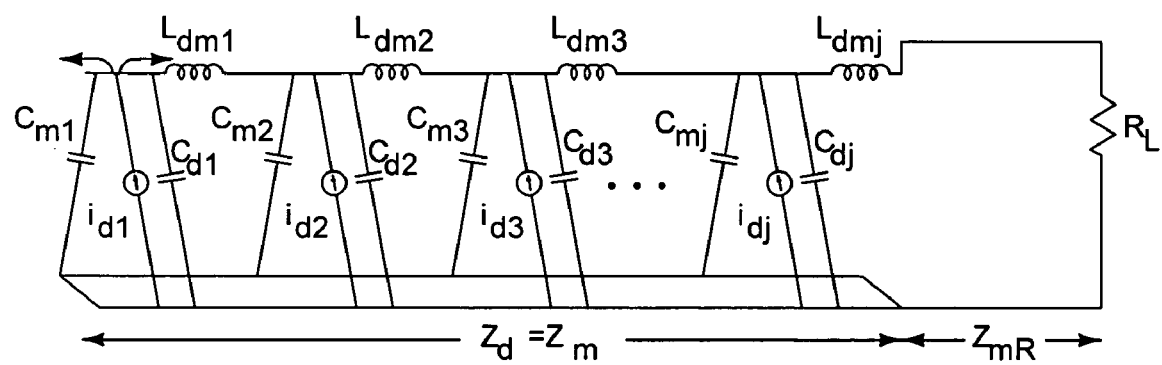

FIG. 1 shows a top schematic view of the series-connected TWPD-TWEAM case. As illustrated, the input lightwave having a signal modulated onto a first wavelength is coupled into SOA 24, where it is amplified and coupled via optical waveguide 38 to TWPD 16, where the optical energy is absorbed along the length of the TWPD 16, generating a photocurrent, $I_p$, that flows to the transmission line electrodes at each point along its length, forming equal traveling-wave voltage signals flowing both in the forward and backward directions relative to the optical wave, $V_{df}=V_{db}=I_dZ_d/2$, as illustrated in FIGS. 7*a–b*. The backward propagating half is reflected at the open-circuited input side of the TWPD 16 transmission line, so that it then also flows in the forward direction in-phase with the forward-going wave after some slight delay. This delay will provide an upper limit on signal bandwidth given by the reciprocal of the transit time of the TWPD 16 (since the power decays exponentially along the length of the TWPD 16 and only half of it is involved). This effect can be avoided by terminating the input side 48 of the TWPD 16 with a resistor equal to its characteristic impedance; however, this will result in a 3 dB loss of input signal. This option is only necessary for very high signal bandwidth, however, because the transit time limited bandwidth for a typical TWPD 16 length of 0.3 mm is >100 GHz. With the open-circuited TWPD 16 at frequencies well below the transit-time limited frequency, a traveling-wave voltage signal, $V_d=I_dZ_d$ can be assumed at the end of TWPD 16. Any residual light exiting the TWPD 16 is absorbed in termination 40 to avoid any crosstalk at the output.

This voltage signal created by the TWPD 16 propagates on interconnecting transmission line 32 to the TWEAM 12. As discussed above, this line may have the same characteristic impedance as TWPD 16 for simple impedance matching, or it may be chosen to have a different value to transform the impedance of TWPD 16 to a different value for better modulation efficiency if the impedance of the other elements is different. The voltage signal then propagates along the electrical transmission line of TWEAM 12, where it modulates the intensity of the lightwave emitted from widely-tunable laser 22, which propagates in optical waveguide 42 and has the desired output wavelength. The structure and material composition of TWEAM 12 may in fact be the same as optical waveguide 42. The modulation within the TWEAM 12 is due to increasing electroabsorption that occurs with increasing reverse bias across the diodes. The relationship between the photocurrent and the TWEAM 12 voltage is illustrated in FIG. 9*b* for the impedance matched case. The operating modulator 12 voltage value is at the intersection of the downward sloping modulator 12 voltage line with the photodetector 16 characteristic relevant for the given input power, $P_{in}$. It is also important to realize that any photocurrent generated in the modulator 12 will subtract from the photocurrent generated in TWPD 16. Thus, the dash-dot modulator 12 voltage line in FIG. 9*b* is plotted for the net current flowing to the load resistor 18.

The output lightwave with the desired output wavelength flows along a second optical waveguide 42 that extends through tunable laser 22, TWEAM 12, and along a path to the output facet 52 of the wavelength converter assembly 10.

Figure 10:
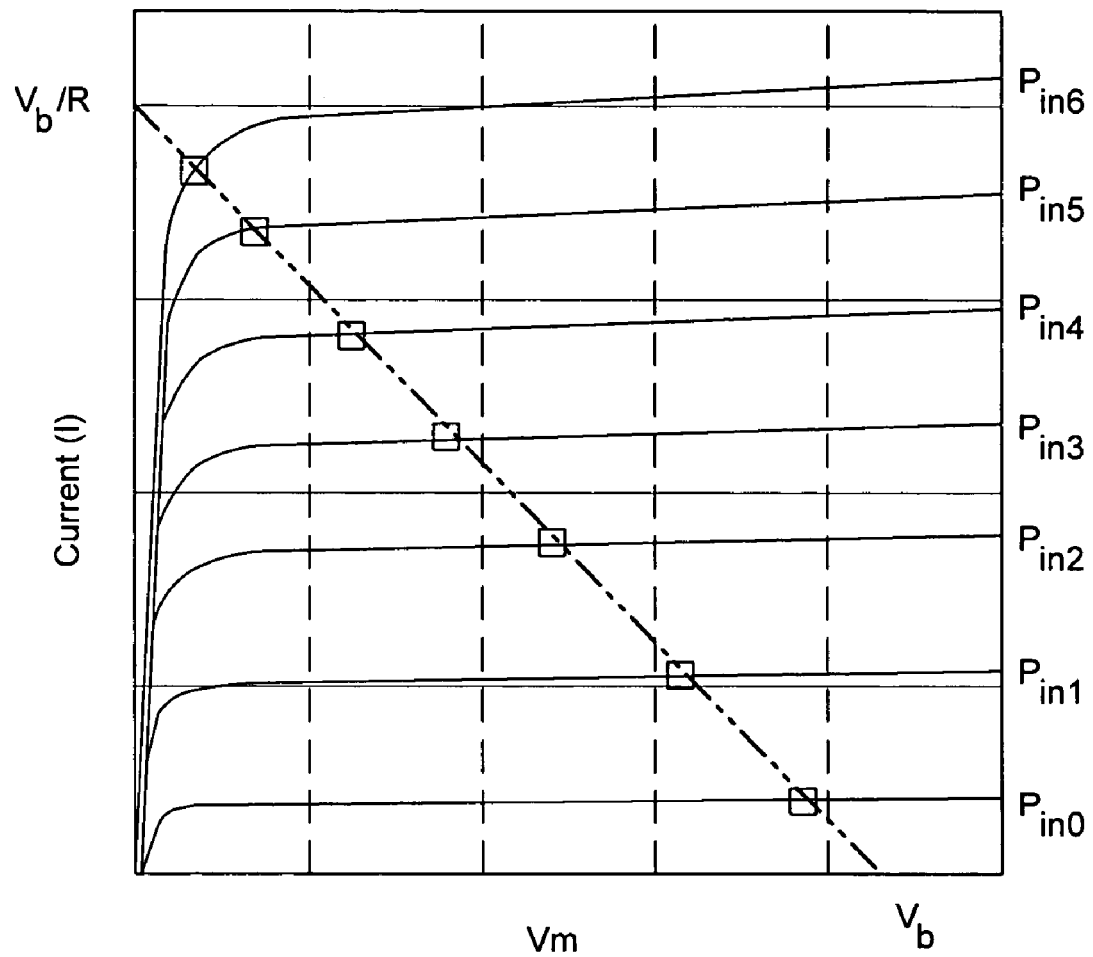
FIG. 10 is a graph that illustrates current—voltage characteristics (I vs. $V_m$) for traveling-wave photodetector [solid-curves] with superimposed traveling-wave modulator voltage, $V_m$, [dash-dot line] for an assumed DC bias voltage of $V_b$ and load resistance, R, wherein loss-less impedance-matched transmission lines are assumed, so that the traveling-wave photodetector and modulator voltages are both equal to $V_m$ and current, $I=I_d-I_m$, propagates along the transmission lines to the load resistor.

The voltage signal exiting the TWEAM 12 propagates to the load resistor 18 via interconnecting transmission line 34 and bias-T 20, where a DC-bias to the line can be applied. Interconnecting transmission line 34 also may have the same characteristic impedance as TWPD 16, interconnecting line 32, TWEAM 12 and load resistor 18, if they are the same, or it may have a different value selected to maximize the modulation, and thus wavelength conversion efficiency, if the impedances of the various elements are different. Bias-T 20 is provided to enable a DC bias to be applied to the diodes of the TWPD 16 and TWEAM 12. The value of this DC bias, shown in FIG. 10 as $V_b$, is usually chosen to optimize the modulation characteristics of TWEAM 12. It should also be understood that this DC bias can be applied in different ways. For example, it can be applied from the open-circuited end of the TWPD 16 via an AC block (e.g., an inductor), or different DC biases can be applied to the TWPD 16 and TWEAM 12 by incorporating separate DC bias ports as well as a DC-block (e.g., a capacitor) between these elements.

FIG. 2 shows a top-view schematic of the parallel-connected TWPD-TWEAM case. The propagation of input light through the SOA 24 and along optical waveguide 38 to TWPD 16 is approximately the same as in the series-connected case of FIG. 1, so no additional comments will be made here. The major difference is that TWPD 16 and TWEAM 12 are positioned along parallel optical waveguides 38 and 42 with a single electrode of a traveling-wave electrical transmission line that extends across both. Thus, as illustrated in FIG. 7, the photocurrent generated by TWPD 16 creates a voltage waveform on the common electrode that is directly applied to the TWEAM 12 without propagating through an interconnecting electrical transmission line. This has the potential advantage of eliminating any electrical losses in this line. However, it is still possible, and generally desirable, to design the length of TWPD 16 to be somewhat shorter than TWEAM 12. The advantages of the traveling-wave structure are still retained, and the operation of the second part of the TWEAM 12 would then be more similar to the case of FIG. 1. Also, as discussed above, the composition of TWPD 16 would generally be different from TWEAM 12 with a first portion that has a low absorption coefficient, which in fact may the same material and structure as the TWEAM 12, and a second portion of high absorption, which may be the same as the gain regions in the laser 22 and SOA 24.

The design and relative positioning of the two optical waveguides 38 and 42, which contain TWPD 16 and TWEAM 12 can take on several forms. At one extreme, the two waveguides 38 and 42 could merge to form a single optical waveguide of the same material and composition. This could minimize the lateral waveguide width for a higher impedance transmission line, but it would also result in mixing the input optical wave with the wavelength converted output wave, and this would then require subsequent optical filtering to remove the unwanted input from the output. The waveguides could be brought close together such that some optical coupling occurred between the two, or the two waveguides could be kept sufficiently far apart, typically several microns, such that no input light in waveguide 38 would couple into the output waveguide 42. The latter case is believed to be most desirable, because the need to separate the input from the output is avoided, and the lengths and compositions of the TWPD 16 and TWEAM 12 can be separately optimized. Also, shown in FIG. 2 is the possibility of a second output of the residual input light wave instead of a termination 40 as illustrated in FIG. 1. Either technique can be used to avoid crosstalk at the output in the no-waveguide-coupling case. But, if the two waveguides are coupled, then the coupling lengths could be chosen such that the input on 38 would still exit the top waveguide, as can be calculated from conventional coupled waveguide theory. This is possible, but again there seems to be little merit in mixing the two optical waves since the wavelength conversion only occurs by the photocurrent of the input lightwave changing the modulation voltage for the output lightwave.

As in the case of FIG. 1, the electrical voltage signal will continue to flow on transmission line 34 from the output of TWEAM 12 to the resistive load 18 with an intermediate DC bias port. Again, impedance transformations are possible if it is desired to have a different load resistance than the characteristic impedance of the electrical transmission line over the TWEAM 12 and TWPD 16. Again, if matched, FIG. 9 illustrates the modulation voltage for a given net current.

As noted above, FIGS. 3, 4 and 5 substitute a TWMZM 14 for the TWEAM 12 shown in FIGS. 1 and 2. In the TWMZM 14 case, the modulation is mainly due to phase modulation in one branch of the interferometer using the electro-refractive effect, so the actual traveling wave modulation is a traveling-wave electro-refraction modulation (TWERM). The CW lightwave from the tunable laser 22 is split at Y-junction 44 and one branch is modulated with the traveling wave voltage signal developed by the TWPD 16. The second branch (the lower one in FIGS. 3, 4 and 5) is typically unmodulated and, when recombined at the second Y-junction 46, the lightwaves will interfere to modulate the amplitude of the output light wave, and thus provide for transfer of the input signal to the output wavelength. It is also common to provide some static bias to the second branch to bias the interference to some desirable point for chirp control or for some other reason. It is also possible to split the traveling wave modulation voltage propagating from the TWPD 16 to tailor the chirp or amplitude linearity characteristics of the TWMZM 14 in some desired way, and this will be obvious to those skilled in the art. Electrically driven TWMZMs 14 have been discussed in the literature, e.g., [9], so these and other modes of operation may be understood by a suitable review of this prior art.

The use of the traveling wave voltage signal derived from the TWPD 16 to modulate the phase of one branch of the TWMZM 14 is the primary difference between this and the TWEAM 12 case. The advantages are that the chirp of the output can be controlled better and because little photocurrent is generated in the phase modulator, much higher output powers are possible before heating and saturation effects become important.

In FIG. 5, a second embodiment of a parallel-connected optoelectronic wavelength converter assembly is shown, including a higher-impedance electrical transmission line 34 between the TWPD 16 and TWMZM 14, as well as a linearized SOA 24 acting as a preamplifier. By segmenting the contacts to the TWPD 16 and TWMZM 14, and by connecting them to the common high-impedance electrical transmission line 34 running therebetween, a higher overall transmission line 34 impedance is provided, and this will increase the propagating voltage magnitude for better wavelength conversion efficiency.

The SOA 24 in this case is linearized by including a grating 54 on its output side to provide for lasing at a wavelength that is somewhat shorter than the range of input signal wavelengths. This clamps the carrier density in the SOA 24, and thereby makes its gain insensitive to the level of the input signal.

FIGS. 7a–b and 8a–b again represent the electrical transmission line aspects for the cases of FIGS. 3 and FIG. 4, respectively, with the same issues and opportunities discussed for the TWEAM 12 cases. FIG. 9 again represents one way of increasing the saturation power and linearity of the TWPD 16, and FIG. 10 again plots the modulator voltage, $V_m$, this time interpreted as the TWMZM 14, for various input optical powers, $P_{in}$. In the TWMZM 14 case, the photocurrent generated by the TWMZM 14 is generally negligible, so that the current axis is only due to the photocurrent from the TWPD 16.

REFERENCES

The following references are incorporated by reference herein:

1. U.S. Pat. No. 6,349,106, issued Feb. 19, 2002, to Coldren, entitled "Method for converting an optical wavelength using a monolithic wavelength converter assembly," and U.S. Pat. No. 6,580,739, issued Jun. 17, 2003, to Coldren, entitled "Integrated opto-electronic wavelength converter assembly," and references cited therein.

2. R. G. Walker, "High-speed III–V semiconductor Intensity Modulators," *IEEE J. Quantum Electronics*, vol. 27, no. 3, March 1991, pp. 654–667.

3. Jayaraman V., Chuang Z-M., Coldren L. A., "Theory, design, and performance of extended tuning range semiconductor lasers with sampled gratings," *IEEE Journal of Quantum Electronics*, vol. 29, no. 6, June 1993, pp. 1824–34.

4. Aoki M., Suzuki M., Sano H., Kawano T., Ido T., Taniwatari T., Uomi K., Takai A., "InGaAs/InGaAsP MQW electroabsorption modulator integrated with a DFB laser fabricated by band-gap energy control selective area MOCVD," *IEEE Journal of Quantum Electronics*, vol. 29, no. 6, June 1993, pp. 2088–96.

5. Xun Li, Huang W-P., Adams D. M., Rolland C., Makino T., "Modeling and design of a DFB laser integrated with a Mach-Zehnder modulator," *IEEE Journal of Quantum Electronics*, vol. 34, no. 10, October 1998, pp. 1807–15.

6. Mason B., Fish G. A., DenBaars S. P., Coldren L. A., "Widely tunable sampled grating DBR laser with integrated electroabsorption modulator," *IEEE Photonics Technology Letters*, vol. 11, no. 6, June 1999, pp. 638–40.

7. N. Dagli, "Wide bandwidth lasers and modulators for RF photonics," *IEEE Trans. Microwave Theory and Tech.*, vol. 47, no. 7, July 1999, pp. 1151–1171.

8. Akage Y., Kawano K., Oku S., Iga R., Okamoto H., Miyarnoto Y., Takeuchi H., "Wide bandwidth of over 50 GHz travelling-wave electrode electroabsorption modulator integrated DFB lasers," *Electronics Letters*, vol. 37, no. 5, 1 March 2001, pp. 299–300.

9. H. Kim, A. H. Gnauck, "Chirp characteristics of dual-drive Mach-Zehnder modulator with a finite DC extinction ratio," *IEEE Photonics Technology Letters*, vol. 14, no. 3, March 2002, pp. 298–300.

10. Barton J. S., Skogen, E. J., Masanovic M., S. Denbaars, L. A. Coldren, "Integration of a Mach-Zehnder Modulator with Sampled Grating Distributed Bragg Reflector Laser," *Proc. Integrated Photonics Research Conference*, paper no. 1FC3-1, Jul. 17–19, 2002.

11. Skogen E. J., Barton J. S., Denbaars S. P., Coldren L. A., "A quantum-well-intermixing process for wavelength-agile photonic integrated circuits," *IEEE Journal of Selected Topics in Quantum Electronics*, vol. 8, no. 4, July–August 2002, pp. 863–9.

12. Y. A. Akulova, G. A. Fish, P-C. Koh, C. L. Show, P. Kozodoy, A. P. Dahl, S. Nakagawa, M. C. Larson, M. P. Mack, T. A. Strand, C. W. Coldren, E. Hegblom, S. K. Penniman, T. Wipiejewski, and L. A. Coldren, "Widely-tunable electroabsorption-modulated sampled-grating DBR laser transmitter" *J. Selected Topics in Quantum Electronics*, vol. 8, no. 6, November/December 2002, pp. 1349–1357.

13. S. Kodama, T. Yoshimatsu, and H. Ito, "320 Gb/s optical gate monolithically integrating photodiode and electroabsorption modulator," *Electronics Letts.*, vol. 39, no. 4, Feb. 20, 2003, pp. 383–385.

14. L. A. Coldren, "Widely-Tunable Chip-Scale Transmitters and Wavelength Converters, Proc. *Integrated Photonics Research Topical Meeting*, OSA, Jun. 16, 2003, Washington, D.C.

15. U.S. Pat. No. 6,574,256, issued Jun. 3, 2003, to Hofstetter et al., entitled "Distributed feedback laser fabricated by lateral overgrowth of an active region."

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A traveling-wave optoelectronic wavelength conversion assembly, comprising:
    a monolithic optoelectronic integrated circuit including an interconnected traveling-wave photodetector (TWPD) and traveling-wave modulator (TWM) with a widely tunable laser source, wherein an input signal modulated onto a first optical wavelength develops a traveling wave voltage on transmission line electrodes of the TWPD, and the traveling wave voltage is coupled via a first interconnecting electrical transmission line to transmission line electrodes of the TWM in order to modulate the input signal onto a second optical wavelength derived from the tunable laser, and the traveling wave voltage continues to propagate along a second interconnecting electrical transmission line to a load resistor.

2. The traveling-wave optoelectronic wavelength conversion assembly of claim 1, wherein the TWPD and TWM are connected in parallel.

3. The traveling-wave optoelectronic wavelength conversion assembly of claim 1, wherein the TWPD and TWM are connected in series.

4. The traveling-wave optoelectronic wavelength conversion assembly of claim 1, wherein the load resistor has a characteristic impedance equal to the second interconnecting electrical transmission line.

5. The traveling-wave optoelectronic wavelength conversion assembly of claim 1, wherein the load resistor and second interconnecting electrical transmission line have different impedances than the TWPD and TWM in order to provide better impedance matching over some signal bandwidth.

* * * * *